(12) United States Patent
Wu et al.

(10) Patent No.: US 9,449,660 B2
(45) Date of Patent: Sep. 20, 2016

(54) SAMPLING CIRCUIT MODULE, MEMORY CONTROL CIRCUIT UNIT, AND METHOD FOR SAMPLING DATA

(71) Applicant: PHISON ELECTRONICS CORP., Miaoli (TW)

(72) Inventors: Jen-Chu Wu, New Taipei (TW); An-Chung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/309,879

(22) Filed: Jun. 19, 2014

(65) Prior Publication Data

US 2015/0311907 A1  Oct. 29, 2015

(30) Foreign Application Priority Data

Apr. 25, 2014 (TW) .............................. 103115032 A

(51) Int. Cl.
| | |
|---|---|
| G11C 7/22 | (2006.01) |
| H03L 7/091 | (2006.01) |
| H03L 7/08 | (2006.01) |
| H03L 7/081 | (2006.01) |
| G11C 7/10 | (2006.01) |

(52) U.S. Cl.
CPC .............. *G11C 7/22* (2013.01); *G11C 7/1093* (2013.01); *H03L 7/0805* (2013.01); *H03L 7/0812* (2013.01)

(58) Field of Classification Search
USPC ........................................................ 365/194
See application file for complete search history.

(56) References Cited

U.S. PATENT DOCUMENTS

| | | | |
|---|---|---|---|
| 6,049,239 A | 4/2000 | Eto et al. | |
| 6,539,072 B1 * | 3/2003 | Donnelly | G06F 1/10 327/158 |
| 6,650,157 B2 * | 11/2003 | Amick | H03L 7/0814 327/149 |
| 6,911,853 B2 | 6/2005 | Kizer et al. | |
| 7,911,873 B1 * | 3/2011 | Menon | G11C 7/1066 365/194 |
| 8,464,135 B2 | 6/2013 | Erez et al. | |
| 2005/0044441 A1 * | 2/2005 | Sohn | G06F 1/10 713/503 |
| 2005/0190874 A1 * | 9/2005 | Poskatcheev | G01R 31/3016 375/355 |
| 2006/0087894 A1 * | 4/2006 | Kim | G11C 7/1066 365/189.02 |
| 2011/0254603 A1 * | 10/2011 | Kamath | H03L 7/00 327/158 |
| 2013/0083611 A1 * | 4/2013 | Ware | G06F 1/3275 365/191 |
| 2013/0121094 A1 * | 5/2013 | Zerbe | H03L 7/091 365/194 |
| 2013/0275654 A1 * | 10/2013 | Chu | G06F 12/0246 711/103 |
| 2015/0049849 A1 * | 2/2015 | Chen | G06F 1/06 375/376 |

OTHER PUBLICATIONS

"Office Action of Taiwan Counterpart Application", issued on Jan. 21, 2015, p. 1-p. 10.

* cited by examiner

*Primary Examiner* — Anthan Tran
*Assistant Examiner* — Mushfique Siddique
(74) *Attorney, Agent, or Firm* — Jianq Chyun IP Office

(57) ABSTRACT

A sampling circuit module, a memory control circuit unit, and a method for sampling data are provided. The sampling circuit module includes a state machine circuit, a first delay line circuit, a second delay line circuit and a delay signal output circuit. In response to a first control signal, the state machine circuit outputs a second control signal and/or a third control signal. The first delay line circuit is configured to receive a reference clock signal and the second control signal to output a first delay clock signal. The second delay line circuit is configured to receive the reference clock signal and the third control signal to output a second delay clock signal. The delay signal output circuit is configured to receive the first delay clock signal and the second delay clock signal to output a third delay clock signal.

22 Claims, 9 Drawing Sheets

SAMPLING CIRCUIT MODULE, MEMORY CONTROL CIRCUIT UNIT, AND METHOD FOR SAMPLING DATA

CROSS-REFERENCE TO RELATED APPLICATION

This application claims the priority benefit of Taiwan application serial no. 103115032, filed on Apr. 25, 2014. The entirety of the above-mentioned patent application is hereby incorporated by reference herein and made a part of this specification.

BACKGROUND

1. Technology Field

The present invention is related to a clock delaying technique and more particularly, to a sampling circuit module, a memory control circuit unit and a method for sampling data.

2. Description of Related Art

In a memory system, a clock signal is commonly served as a basis during a circuit operation. Generally, a clock signal is generated by an oscillator and transmitted to each chip in the memory system through a connecting line. However, a phase shift may occur during the transmission of the clock signal. The temperature and change of a voltage provided by the system may also be reasons which cause the phase shift. The phase shift may lead the memory system to a rise in an error rate when performing a data writing or reading operation.

Delay-locked loops (DLL) are used for resolving an unsynchronization issue of the clock signal transmitted to each chip. The delay-locked loops may be classified into two types, analog delay circuits and digital delay circuits. An analog delay circuit controls a delay time of a delay line by using a voltage, and an output clock of the analog delay circuit is easily interfered by noise from a power source and temperature. A digital delay circuit dynamically changes an amount of delay or a delay stage of the delay line by means of transmitting an indication signal and has better capability for resisting the interference. Changes in the amount of delay or the delay stage of the delay line of the digital delay circuit usually lead to clock jitter during the clock signal being output.

Specially, for a memory system using the digital delay circuit, when data is being written into or read from the memory system, the accuracy of the read or written data may be reduced if a phase shift of the clock signal is too large and is not corrected immediately.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention provides a sampling circuit module, a memory control circuit unit, and a method for sampling data capable of improving the accuracy of data sampling.

According to an exemplary embodiment of the present invention, a sampling circuit module including a delay-locked loop and a sampling circuit is provided. The delay-locked loop includes a control circuit and a delay circuit. The control circuit is configured to receive a reference clock signal to output a first control signal. The delay circuit is coupled to the control circuit and includes a state machine circuit, a first delay line circuit, a second delay line circuit and a delay signal output circuit. The state machine circuit is configured to receive the first control signal and output a second control signal and/or a third control signal in response to the first control signal. The first delay line circuit is coupled to the state machine circuit and configured to receive the reference clock signal and the second control signal to output a first delay clock signal. The second delay line circuit is coupled to the state machine circuit and configured to receive the reference clock signal and the third control signal to output a second delay clock signal. The delay signal output circuit is coupled to the first delay line circuit, the second delay line circuit and the state machine circuit and configured to receive the first delay clock signal and the second delay clock signal to output a third delay clock signal. The sampling circuit is coupled to the delay-locked loop and configured to receive the third delay clock signal and sample a data signal according to the third delay clock signal to obtain sampled data.

According to another exemplary embodiment of the present invention, a memory control circuit unit for controlling a rewritable non-volatile memory module is provided. The rewritable non-volatile memory module includes a plurality of physical erasing units. The memory control circuit unit includes a host interface, a memory interface, a sampling circuit module and a memory management circuit. The host interface is configured to be coupled to a host system. The memory interface is configured to be coupled to the rewritable non-volatile memory module. The sampling circuit module includes a delay-locked loop and a sampling circuit. The delay-locked loop includes a control circuit and a delay circuit. The control circuit is configured to receive a reference clock signal to output a first control signal. The delay circuit is coupled to the control circuit and includes a state machine circuit, a first delay line circuit, a second delay line circuit and a delay signal output circuit. The state machine circuit is configured to receive the first control signal and output a second control signal and/or a third control signal in response to the first control signal. The first delay line circuit is coupled to the state machine circuit and configured to receive the reference clock signal and the second control signal to output a first delay clock signal. The second delay line circuit is coupled to the state machine circuit and configured to receive the reference clock signal and the third control signal to output a second delay clock signal. The delay signal output circuit is coupled to the first delay line circuit, the second delay line circuit and the state machine circuit and configured to receive the first delay clock signal and the second delay clock signal to output a third delay clock signal. The sampling circuit is coupled to the delay-locked loop and configured to receive the third delay clock signal and sample a data signal according to the third delay clock signal to obtain sampled data. The memory management circuit is coupled with the host interface, the memory interface and the sampling circuit module and configured to issue a writing command sequence. The writing command sequence is configured to write data corresponding to the sampled data into the rewritable non-volatile memory module.

According to yet another embodiment of the present invention, a method for sampling data is provided. The method includes: receiving a first control signal and outputting a second control signal and/or a third control signal in response to the first control signal, outputting a first delay clock signal according to a reference clock signal and the second control signal, outputting a second delay clock signal according to the reference clock signal and the third control signal, outputting a third delay clock signal according to the first delay clock signal and the second delay clock signal, sampling a data signal according to the third delay clock signal to obtain sampled data, and issuing a writing command sequence, where the writing command sequence is configured to write data corresponding to the sampled data into the rewritable non-volatile memory module.

To sum up, in response to the first control signal, the state machine circuit can control the first delay line circuit through the second control signal and control the second delay line circuit through the third control signal. The delay signal output circuit can generate the third delay clock signal according to the first delay clock signal output by the first delay line circuit and the second delay clock signal output by the second delay line circuit. Thereby, the delay clock signals can be continuously output, and phases of the output delay clock signals can be continuously locked by means of maintaining a normal output from at least one of the delay line circuits and updating an amount of the delay or a delay stage of an idling delay circuit in background. Furthermore, the probability of clock jitter can be relatively reduced.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
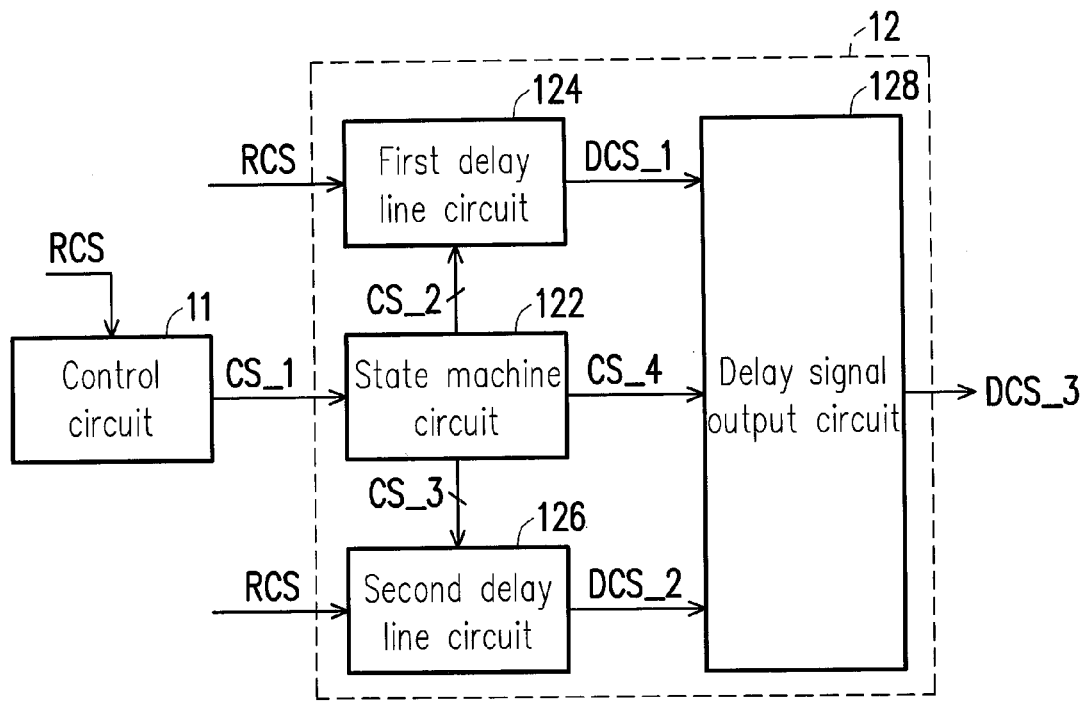
FIG. 1 is a schematic diagram illustrating a delay-locked loop according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

FIG. 1 is a schematic diagram illustrating a delay-locked loop according to an exemplary embodiment of the present invention.

With reference to FIG. 1, a delay-locked loop (DLL) 10 includes a control circuit 11 and a delay circuit 12. In an exemplary embodiment, the delay-locked loop 10 may also be referred as a master-slave delay-locked loop. The control circuit 11 may also be referred as a master delay circuit in the master-slave delay-locked loop, and the delay circuit 12 may also be referred as a slave delay circuit in the master-slave delay-locked loop. Generally, in the delay-locked loop 10, the number of the control circuit 11 may be one, while the number of the delay circuit 12 may be one or more. In the present exemplary embodiment, the delay-locked loop 10 is a digital delay-locked loop. However, in another exemplary embodiment, the delay-locked loop 10 may also be an analog delay-locked loop.

The control circuit 11 is configured to receive a reference clock signal RCS to output a first control signal CS_1. The reference clock signal RCS is generated by an oscillator, for example.

Figure 2:
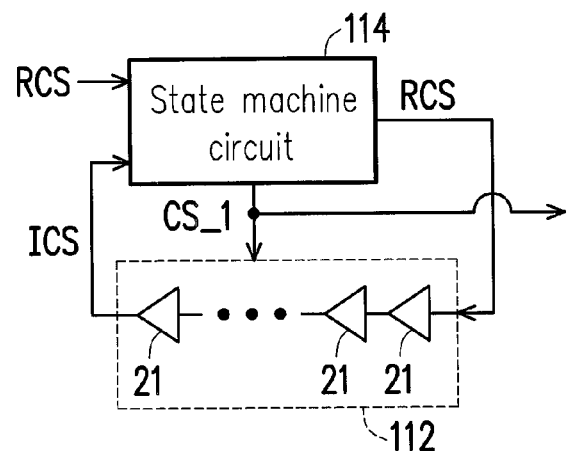
FIG. 2 is a schematic diagram illustrating a control circuit according to an exemplary embodiment of the present invention.

FIG. 2 is a schematic diagram illustrating a control circuit according to an exemplary embodiment of the present invention.

Referring to FIG. 2, in an exemplary embodiment, the control circuit 11 includes a delay line circuit 112 and a state machine circuit 114.

The delay line circuit 112 includes a plurality of delay units 21. The delay units 21 may be connected in series or any manner with one another, and each of the delay units 21 may be a forward or an inverse delay element. When the reference clock signal RCS pass through the delay line circuit 112, the delay line circuit 112 outputs an internal clock signal ICS.

The state machine circuit 114 is configured to receive the reference clock signal RCS and the internal clock signal ICS, and generate the first control signal CS_1 according to a phase difference between the reference clock signal RCS and the internal clock signal ICS. The first control signal CS_1 is configured to control an amount of delay of the delay line circuit 112, such that the phase difference between the internal clock signal ICS and the reference clock signal RCS may be close to a predetermined value (e.g., ¼ clock cycle for the internal clock signal ICS falling behind the reference clock signal RCS). If a phase of the internal clock signal ICS leads a phase of the reference clock signal RCS too much, the first control signal CS_1 instructs to increase the amount of delay of the delay line circuit 112. If the phase of the internal clock signal ICS falls behind the phase of the reference clock signal RCS too much, the first control signal CS_1 instructs to decrease the amount of delay of the delay line circuit 112. In an exemplary embodiment, the amount of delay of the delay line circuit 112 may be presented by using a delay stage. For instance, the greater the delay stage of the delay line circuit 112, the greater amount of delay of the delay line circuit 112; the smaller the delay stage of the delay line circuit 112, the smaller amount of delay of the delay line circuit 112. How to control the amount of delay or the delay stage of the delay line circuit 112 shall pertain to the ordinary knowledge of the art, and will not be repeatedly described. Specially, if the phase difference between the reference clock signal RCS and the internal clock signal ICS is successfully close to and maintained at the predetermined value, it indicates that a phase lock is achieved. Additionally, the state machine circuit 114 may include a phase detector (not shown) and a micro-controller (not shown). The phase detector is configured to detect the phase difference between the internal clock signal ICS and the reference clock signal RCS, and the micro controller is configured to generate the first control signal CS_1 according to a detection result of the phase detector.

Referring to FIG. 1 again, the delay circuit 12 is coupled to the control circuit 11. The delay circuit 12 includes a state machine circuit 122, a first delay line circuit 124, a second delay line circuit 126 and a delay signal output circuit 128.

The state machine circuit 122 is coupled to the control circuit 11 and configured to receive the first control signal CS_1 and output a second control signal CS_2 and/or a third control signal CS_3 in response to the first control signal CS_1. In particular, the second control signal CS_2 is configured to control a delay stage (i.e., a first delay stage) of the first delay line circuit 124, and the third control signal CS_3 is configured to control a delay stage (i.e., a second delay stage) of the second delay line circuit 126. In the present exemplary embodiment, the state machine circuit 122 continuously transmits the second control signal CS_2 to the first delay line circuit 124 and continuously transmits the third control signal CS_3 to the second delay line circuit 126. However, in another exemplary embodiment, the state machine circuit 122 transmits the second control signal CS_2 only when the first delay stage of the first delay line circuit 124 has to be changed, and the state machine circuit 122 transmits the third control signal CS_3 only when the second delay stage of the second delay line circuit 126 has to be changed.

The first delay line circuit 124 is coupled to the state machine circuit 122 and configured to receive the reference clock signal RCS and the second control signal CS_2 to output a first delay clock signal DCS_1. To be specific, an input terminal of the first delay line circuit 124 receives the reference clock signal RCS, a control terminal of the first delay line circuit 124 receives the second control signal CS_2 and adjusts the first delay stage in response to the second control signal CS_2. Along with the first delay stage being adjusted, a length of the first delay line circuit 124 is also adjusted. The first delay line circuit 124 delays the reference clock signal RCS according to the adjusted first delay stage and outputs the first delay clock signal DCS_1 from an output terminal of the first delay line circuit 124.

The second delay line circuit 126 is coupled to the state machine circuit 122 and configured to receive the reference clock signal RCS and the third control signal CS_3 to output a second delay clock signal DCS_2. To be specific, an input terminal of the second delay line circuit 126 receives the reference clock signal RCS, a control terminal of the second delay line circuit 126 receives the third control signal CS_3 and adjusts the second delay stage in response to the third control signal CS_3. Along with the second delay stage being adjusted, a length of the second delay line circuit 126 is also adjusted. The second delay line circuit 126 delays the reference clock signal RCS according to the adjusted second delay stage and outputs the second delay clock signal DCS_2 from an output terminal of the first delay line circuit 126.

The delay signal output circuit 128 is coupled to the state machine circuit 122, the first delay line circuit 124 and the second delay line circuit 126 and configured to receive the first delay clock signal DCS_1 and the second delay clock signal DCS_2 to output a third delay clock signal DCS_3. For instance, after receiving the first delay clock signal DCS_1 and the second delay clock signal DCS_2, the delay signal output circuit 128 may output the first delay clock signal DCS_1 and/or the second delay clock signal DCS_2 directly or through one or more circuit elements (e.g., a switch circuit, a forward or an inverse delay element), which are/is served as the third delay clock signal DCS_3. Specially, a phase of the third delay clock signal DCS_3 may be the same as the phase of the first delay clock signal DCS_1, be the same as the phase of the second delay clock signal DCS_2 or be the same as a phase of a signal generated by combining the first delay clock signal DCS_1 and the second delay clock signal DCS_2 by means of phase interpolation.

In an exemplary embodiment, the state machine circuit 122 is further configured to output a fourth control signal CS_4 in response to the first control signal CS_1, and the delay signal output circuit 128 receives the first delay clock signal DCS_1, the second delay clock signal DCS_2 and the fourth control signal CS_4 to output the third delay clock signal DCS_3.

Figure 3:
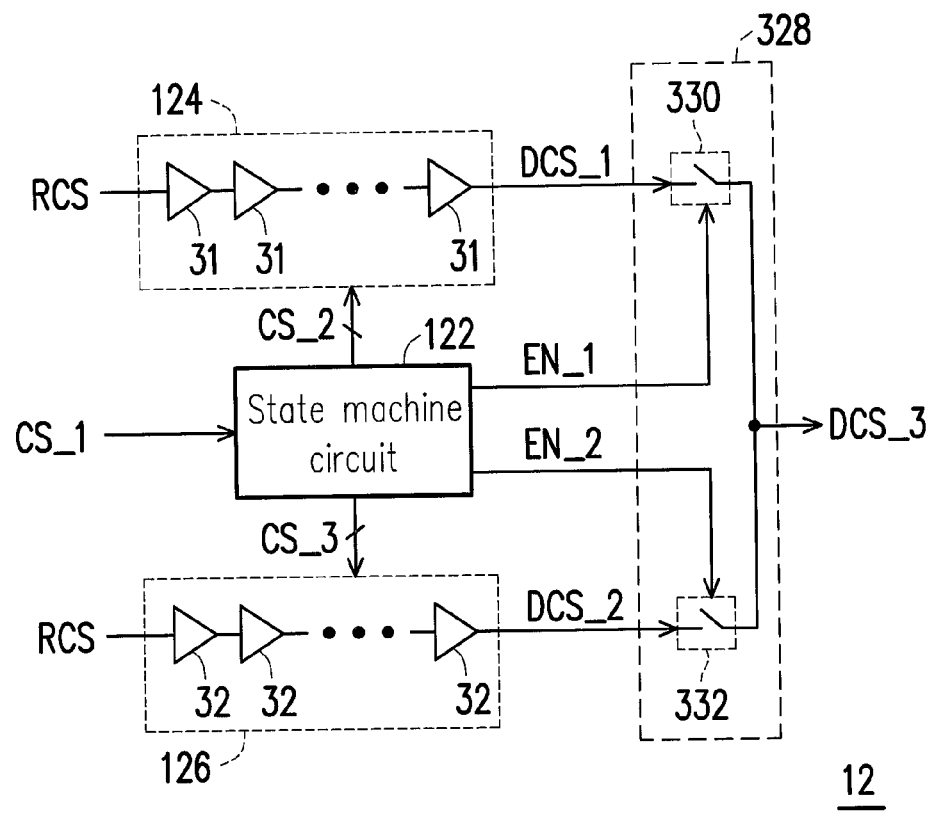
FIG. 3 is a schematic diagram illustrating a delay circuit according to an exemplary embodiment of the present invention.

FIG. 3 is a schematic diagram illustrating a delay circuit according to an exemplary embodiment of the present invention.

With reference to FIG. 3, the first delay line circuit 124 includes a plurality of delay units 31 (i.e., first delay units), the second delay line circuit 126 includes a plurality of delay units 32 (i.e., second delay units), the delay units 31 may be connected in series with one another, and the delay units 32 may be connected in series with one another. Each of the delay units 31 and/or each of the delay units 32 may be a forward or an inverse delay element.

In the present exemplary embodiment, a delay signal output circuit 328 includes a first switch circuit 330 and a second switch circuit 332. The first switch circuits 330 and the second switch circuits 332 include one or more switches, respectively. The fourth control signal includes a first enable signal EN_1 and a second enable signal EN_2. The first enable signal EN_1 is configured to control a switching state (i.e., a first switching state) of the first switch circuit 330, and the second enable signal EN_2 is configured to control a switching state (i.e., a second switching state) of the second switch circuit 332. However, in another exemplary embodiment, the first switch circuits 330 and the second switch circuits 332 may also be combined as a switch and selects to turn on a path from the first delay line circuit 124 to an output terminal of the delay signal output circuit 328 or to turn on a path from the second delay line circuit 126 to the output terminal of the delay signal output circuit 328, and the switch is controlled by the fourth control signal CS_4.

In the present exemplary embodiment, the state machine circuit 122 does not allow a scenario where both the first switch circuit 330 and the second switch circuit 332 are in a turn-on state simultaneously. If the first switch circuit 330 is in a turn-off state, the first delay line circuit 124 may be considered as in an idle state. If the first delay line circuit 124 is in the idle state, the first delay stage of the first delay line circuit 124 may be updated in background. Similarly, if the second switch circuit 332 is in the turn-off state, the second delay line circuit 126 may be considered as in the idle state. If the second delay line circuit 126 is in the idle state, the second delay stage of the second delay line circuit 126 may be updated in background. In other words, at any time point, at least one of the first delay line circuit 124 and the second delay line circuit 126 normally outputs the signal. Additionally, the first delay stage of the first delay line circuit 330 is changed only when the first switch circuit 330 is in the turn-off state, and the second delay stage of the second delay line circuit 126 is changed only when the second switch circuit 332 is in the turn-off state.

If it is assumed that the first switch circuit 330 is currently in the turn-on state, the second switch circuit 332 is in the turn-off state, and the first control signal CS_1 instructs that the delay stage of the delay line circuit has to be adjusted. In this case, the state machine circuit 122 adjusts the second delay stage of the second delay line circuit 126 according to the first control signal CS_1. After the second delay stage of the second delay line circuit 126 is completely adjusted and the output second delay clock signal DCS_2 tends to be stable (e.g., after 1 to 2 clock cycles), the state machine circuit 122 switches the first switch circuit 330 from the turn-on state to the turn-off state through the first enable signal EN_1 and synchronously switches the second switch circuit 332 from the turn-off state to the turn-on state through the second enable signal EN_2. In this way, the delay signal output circuit 128 may immediately switch from outputting the first delay clock signal DCS_1 to outputting the second delay clock signal DCS_2 which is served as the third delay clock signal DCS_3.

Figure 4:
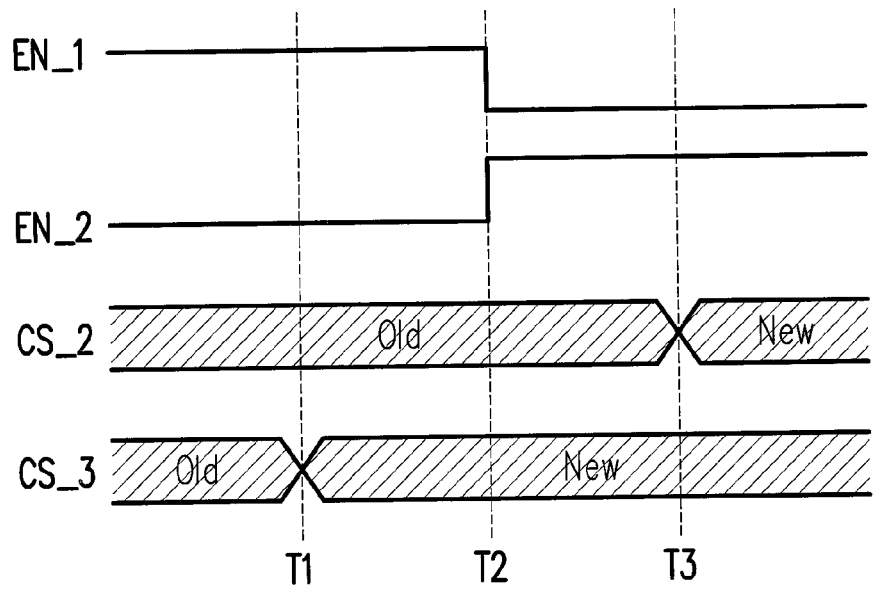
FIG. 4 is a timing schematic diagram of adjusting a delay stage according to an exemplary embodiment of the present invention.

FIG. 4 is a timing schematic diagram of adjusting a delay stage according to an exemplary embodiment of the present invention.

With reference to FIG. 4, if it is assumed that before a time point T1, the first enable signal EN_1 is at a high level, and the second enable signal EN_2 is at a low level, the first switch circuit 330 is in the turn-on state, the second switch circuit 332 is in the turn-off state, and the state machine circuit controls the first delay line circuit 124 and the second delay line circuit 126 through the second control signal CS_2 and the third control signal CS_3 which carry old delay information (for instance, both the delay stages of the first delay line circuit 124 and the second delay line circuit 126 are "9"). At the time point T1, in response to the first control signal CS_1 which instructs that the delay stage of the delay line circuit has to be adjusted, the state machine circuit 122 transmits the third control signal CS_3 carrying new delay information to the second delay line circuit 126 to adjust the second delay stage of the second delay line circuit 126 (for instance, adjust the second delay stage of the second delay line circuit 126 from "9" to "10"). After 1 to 2 clock cycles, at a time point T2, the state machine circuit 122 switches the first enable signal EN_1 to a low level and switches the second enable signal EN_2 to a high level simultaneously, such that the first switch circuit 330 is in the turn-off state, and the second switch circuit 332 is in the turn-on state. At any time point (e.g., a time point T3) after the time point T2, the state machine circuit 122 transmits the second control signal CS_2 carrying the new delay information to the first delay line circuit 124 to adjust the first delay stage of the first delay line circuit 124 (for instance, adjust the first delay stage of the first delay line circuit 124 from "9" to "10"). Thus, the first delay stage of the first delay line circuit 124 and the second delay stage of the second delay line circuit 126 are updated in one time. In other words, before the time point T2, the phase of the third delay clock signal DCS_3 is basically the same as the phase of the first delay clock signal DCS_1; after the time point T2, the phase of the third delay clock signal DCS_3 is the same as the phase of the second delay clock signal DCS_2, and even around the time point T2, the clock jitter issue also does not easily occur to the third delay clock signal DCS_3.

It is to be mentioned that in the exemplary embodiment illustrated in FIG. 3 and FIG. 4, the state machine circuit 122 may have to carefully determine the timing (e.g., the time point T2) for switching the first enable signal EN_1 and the second enable signal EN_2, such that a flat area of the first delay clock signal DCS_1 may be connected with a flat area of the second delay clock signal DCS_2. For instance, in an exemplary embodiment, the time point T2 is at a position of ¼ pulse cycle of the first delay clock signal DCS_1. If the flat area of the first delay clock signal DCS_1 is not connected with the flat area of the second delay clock signal DCS_2, the clock jitter issue may occur to the third delay clock signal DCS_3.

Figure 5:
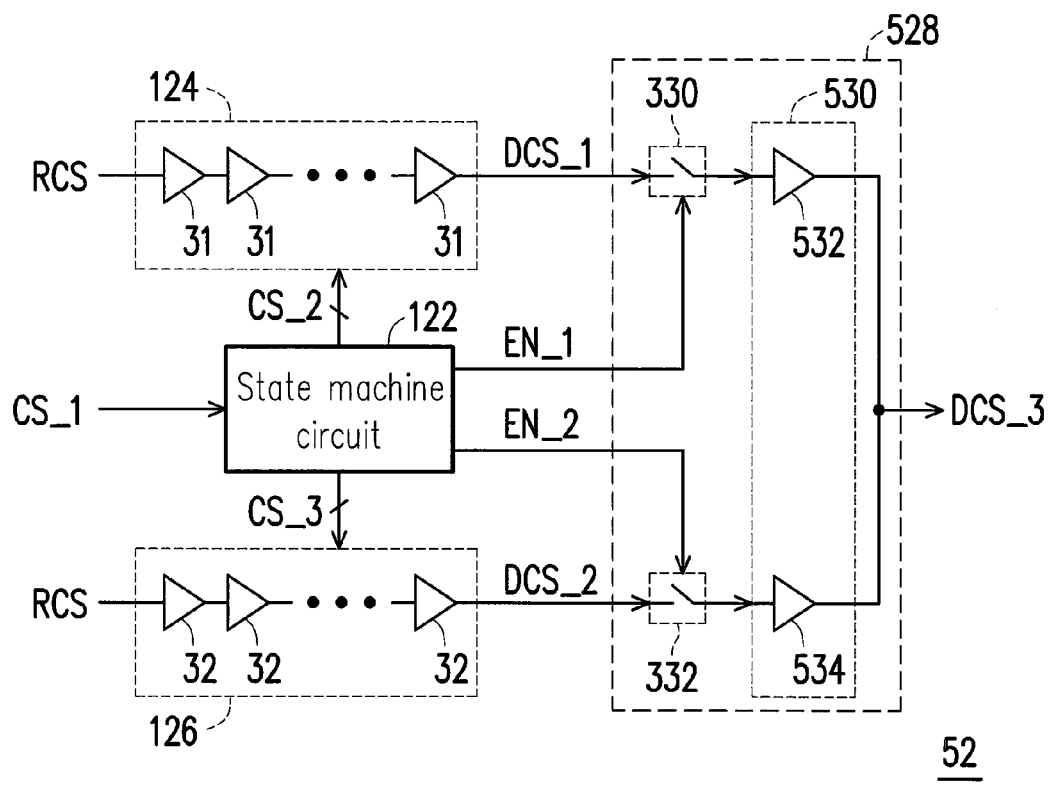
FIG. 5 is a schematic diagram illustrating a delay circuit according to another exemplary embodiment of the present invention.

FIG. 5 is a schematic diagram illustrating a delay circuit according to another exemplary embodiment of the present invention.

Referring to FIG. 5, a delay circuit 52 includes a state machine circuit 122, a first delay line circuit 124, a second delay line circuit 126 and a delay signal output circuit 528.

The state machine circuit 122, the first delay line circuit 124 and the second delay line circuit 124 of the present exemplary embodiment are respectively the same as or similar to the state machine circuit 122, the first delay line circuit 124 and the second delay line circuit 126 of the exemplary embodiment illustrated in FIG. 3, and thus, will not be repeatedly described.

The delay signal output circuit 528 includes a first switch circuit 330, a second switch circuit 332 and a phase interpolation circuit 530. The first switch circuit 330 and the second switch circuit 332 of the present exemplary embodiment are respectively the same as or similar to the first switch circuit 330 and the second switch circuit 332 of the exemplary embodiment illustrated in FIG. 3, and thus, will not be repeatedly described.

The phase interpolation circuit 530 is configured to receive an output signal (i.e., a first output signal) of the first switch circuit 330 and/or an output signal (i.e., a second output signal) of the second switch circuit 332 to form the third delay clock signal DCS_3. To be specific, the phase interpolation circuit 530 includes one or more third delay units 532 and one or more fourth delay units 534. Each third delay unit 532 is coupled in series with one another, and an input terminal of the third delay unit 532 is coupled to an output terminal of the first switch circuit 330. Each fourth delay unit 534 is also coupled in series with one another, and an input terminal of the fourth delay unit 534 is coupled to an output terminal of the second switch circuit 332. An output terminal of the third delay unit 532 and an output terminal of the fourth delay unit 534 are coupled to an output terminal of the phase interpolation circuit 530. If both the first switch circuit 330 and the second switch circuit 332 are in the turn-on state simultaneously, the phase interpolation circuit 530 performs phase interpolation on the output signal of the first switch circuit 330 and the output signal of the second switch circuit 332. After the phase interpolation is performed, a phase of an output signal (i.e., the third delay clock signal DCS_3) of the phase interpolation circuit 530 is between the phase of the output signal of the first switch circuit 330 and the phase of the output signal of the second switch circuit 332, and the clock jitter does not occur easily. In addition, if the first delay stage of the first delay line circuit 124 and the second delay stage of the second delay line circuit 126 are switched gradually (e.g., increased or decreased stage by stage), rather than switched by bypassing several stages (e.g., bypassing from the third stage to the ninth stage) at once, the probability of the clock jitter occurring to the output signal (i.e., the third delay clock signal DCS_3) of the phase interpolation circuit 530 may be further reduced.

Figure 6:
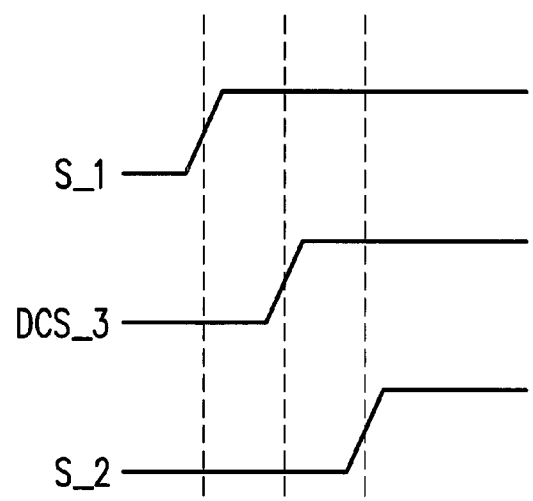
FIG. 6 is a schematic diagram of phase interpolation according to an exemplary embodiment of the present invention.

FIG. 6 is a schematic diagram of phase interpolation according to an exemplary embodiment of the present invention.

With reference to FIG. 6, if it is assumed that the first switch circuit 330 outputs a signal S_1, and the second switch circuit 332 outputs a signal S_2, after the phase interpolation is performed, a phase of the output signal (i.e., the third delay clock signal DCS_3) of the phase interpolation circuit 530 is between a phase of the signal S_1 and a phase of the signal S_2.

Namely, the main difference between the present exemplary embodiment and the exemplary embodiment illustrated in FIG. 3 is that in the present exemplary embodiment, both the first switch circuit 330 and the second switch circuit 332 may be in the turn-on state simultaneously. In other words, it is sufficient for the state machine circuit 122 to only notice that the first delay stage of the first delay line circuit 124 is changed only when the first switch circuit 330 is in the turn-off state, and that the second delay stage of the second delay line circuit 126 is also changed only when the second switch circuit 126 is in the turn-off state, instead of carefully limiting the timing for switching the first switch circuit 330 and the second switch circuit 332 (which is illustrated in FIG. 4). Thereby, the computational burden of the state machine circuit 122 may effectively mitigated.

Figure 7:
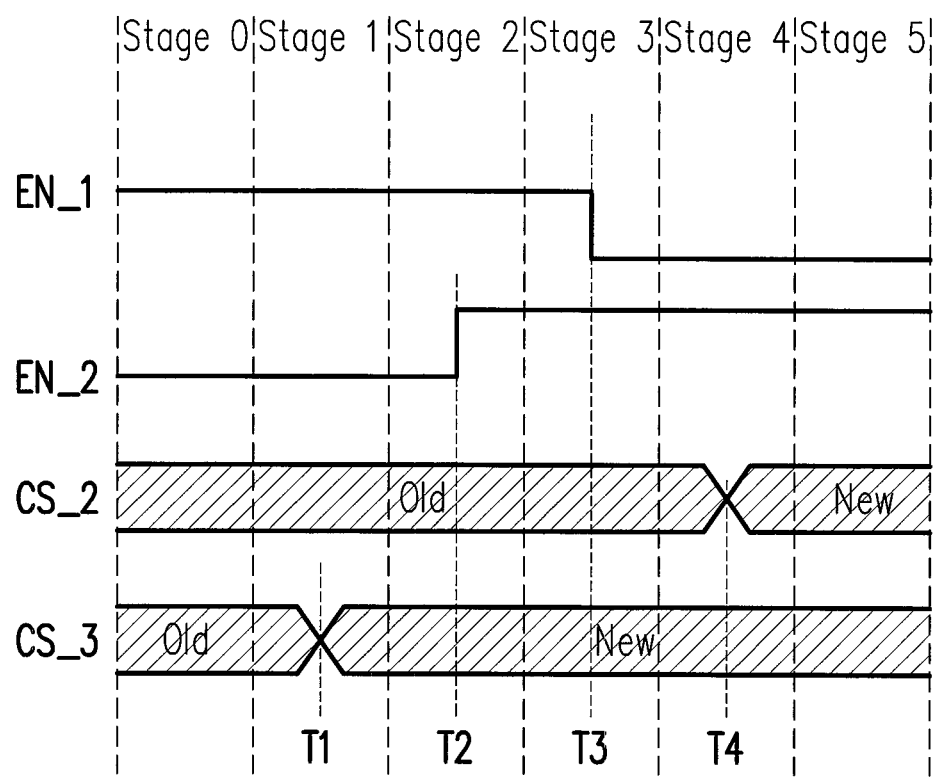
FIG. 7 is a timing schematic diagram of adjusting a delay stage according to another exemplary embodiment of the present invention.

FIG. 7 is a timing schematic diagram of adjusting a delay stage according to another exemplary embodiment of the present invention.

With reference to FIG. 7, if it is assumed that in stage 0, the first enable signal EN_1 is at the high level, and the second enable signal EN_2 is at the low level, the first switch circuit 330 is in the turn-on state, the second switch circuit 332 is in the turn-off state, and the state machine circuit 122 controls the first delay line circuit 124 and the second delay line circuit 126 through the second control signal CS_2 and the third control signal CS_3 which carry the old delay information (for instance, both the delay stages of the first delay line circuit 124 and the second delay line circuit 126 are "9"). In stage 1 (e.g., at the time point T1), in response to the first control signal CS_1 which instructs that the delay stage of the delay line circuit has to be adjusted, the state machine circuit 122 transmits the third control signal CS_3 carrying the new delay information to the second delay line circuit 126 to adjust the second delay stage of the second delay line circuit 126 (for instance, adjust the second delay stage of the second delay line circuit 126 from "9" to "10"). After the second delay stage of the second delay line circuit 126 is completely adjusted and the output second delay clock signal DCS_2 tends to be stable (e.g., after 1 to 2 clock cycles), in stage 2 (e.g., at the time point T2), the state machine circuit 122 switches the second enable signal EN_2 to the high level, such that the second switch circuit 332 is in the turn-on state. Then, in stage 3 (e.g., at the time point T3), the state machine circuit 122 switches the first enable signal EN_1 to the low level, such that the first switch circuit 330 is in the turn-off state. Namely, from the time point T2 to the time point T3, both the first switch circuit 330 and the second switch circuit 332 are in the turn-on state, and the phase interpolation circuit 530 performs the phase interpolation on the output signal of the first switch circuit 330 and the output signal of the second switch circuit 332. In stage 4 (e.g., at a time point T4), the state machine circuit 122 transmits the second control signal CS_2 carrying the new delay information to the first delay line circuit 124 to adjust the first delay stage of the first delay line circuit 124 (for instance, adjust the first delay stage of the first delay line circuit 124 from "9" to "10"). In stage 5, both the first delay stage of the first delay line circuit 124 and the second delay stage of the second delay line circuit 126 are completely updated. In this way, during the process of updating the first delay stage of the first delay line circuit 124 and the second delay stage of the second delay line circuit 126, the clock jitter does easily occur to the output signal (i.e., the third delay clock signal DCS_3) of the phase interpolation circuit 530. However, the aforementioned stage 0 to stage 5 are used for descriptive convenience, instead of limiting the present invention.

It should be noted that in the exemplary embodiments illustrated in FIG. 1 to FIG. 7, the circuit structure of the delay-locked loop 10 is only an example, and electronic components may be further added therein according to electrical characteristics of the delay-locked loop 10. For instance, a capacitor, a resistor, a transistor and the like may be added to a position where the electrical characteristics should be improved. Additionally, in an exemplary embodiment, the delay-locked loop 10 is applied in a memory storage device (i.e., a memory storage system) or is applied to a memory control circuit unit for controlling the memory storage device.

Generally, the memory storage device includes a rewritable non-volatile memory module and a controller (i.e. a control circuit). The memory storage device is usually used together with a host system, such that the host system can write data into or read data from the memory storage device.

Figure 8:
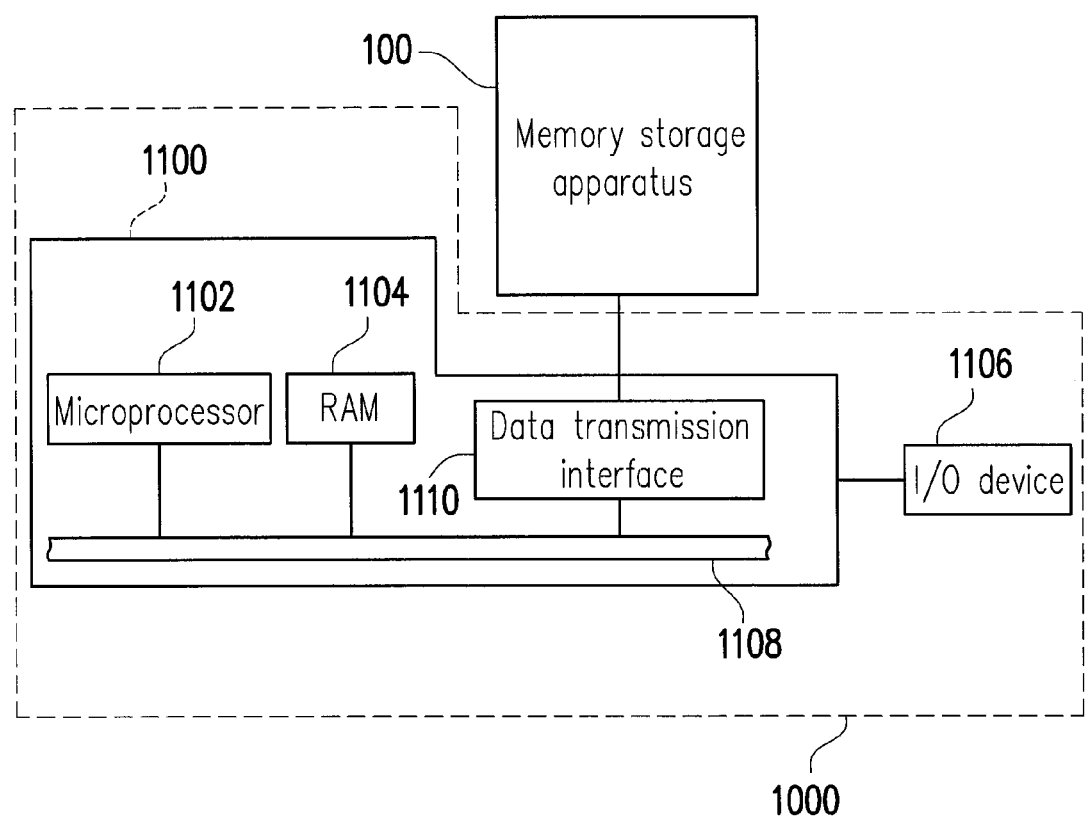
FIG. 8 is a schematic diagram of a host system and a memory storage device according to an exemplary embodiment of the present invention.
Figure 9:
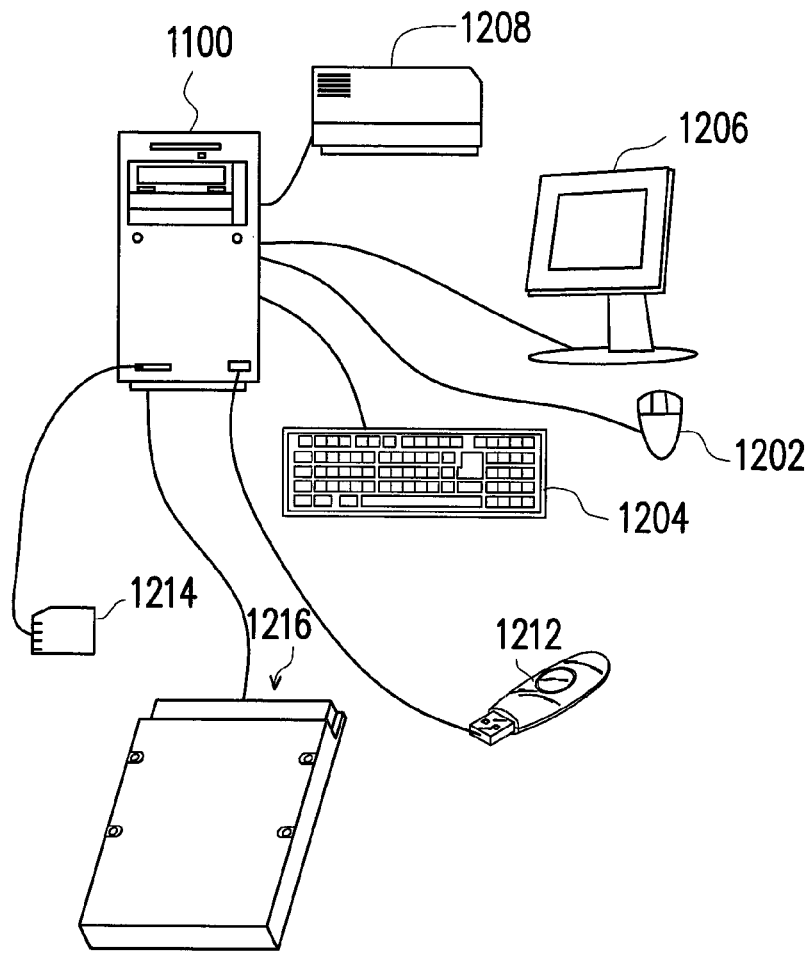
FIG. 9 is a schematic diagram of a computer system and an input/output (I/O) device according to an exemplary embodiment of the present invention.
Figure 10:
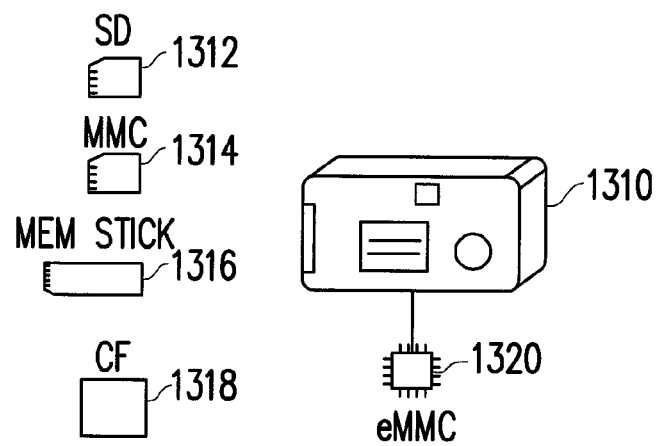
FIG. 10 is a schematic diagram of a host system and a memory storage device according to another exemplary embodiment of the present invention.

FIG. 8 is a schematic diagram of a host system and a memory storage device according to another exemplary embodiment of the present invention. FIG. 9 is a schematic diagram of a computer system and an input/output (I/O) device according to an exemplary embodiment of the present invention. FIG. 10 is a schematic diagram of a host system and a memory storage device according to another exemplary embodiment of the present invention.

Referring to FIG. 8, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 2. It should be understood that the devices illustrated in FIG. 9 are not intended to limit the I/O device 1106, and the I/O device 1106 may further include other devices.

The memory storage device 100 is coupled to other elements of the host system 1000 through the data transmission interface 1110. With the operation of the microprocessor 1102, the RAM 1104 and the I/O device 1106, data can be written into or read from the memory storage device 100. For instance, the memory storage device 100 may be a rewritable non-volatile memory storage device, such as a flash drive 1212, a memory card 1214, or a solid state drive (SSD) 1216, as shown in FIG. 9.

Generally, the host system 1000 can substantially be any system collocated with the memory storage device 100 for storing data. Even though the host system 1000 is implemented as a computer system in the present exemplary embodiment, in another exemplary embodiment of the present invention, the host system 1000 may be a digital camera, a video camera, a telecommunication device, an audio player, or a video player. For example, in a scenario that the host system is a digital camera (video camera) 1310, the rewritable non-volatile memory storage device is a secure digital (SD) card 1312, a multi media card (MMC) 1314, a memory stick 1316, a compact flash (CF) card 1318 or an embedded storage device 1320 (as shown in FIG. 10). The embedded storage device 1320 includes an embedded MMC (eMMC). It should be mentioned that the eMMC is directly coupled to a substrate of the host system.

Figure 11:
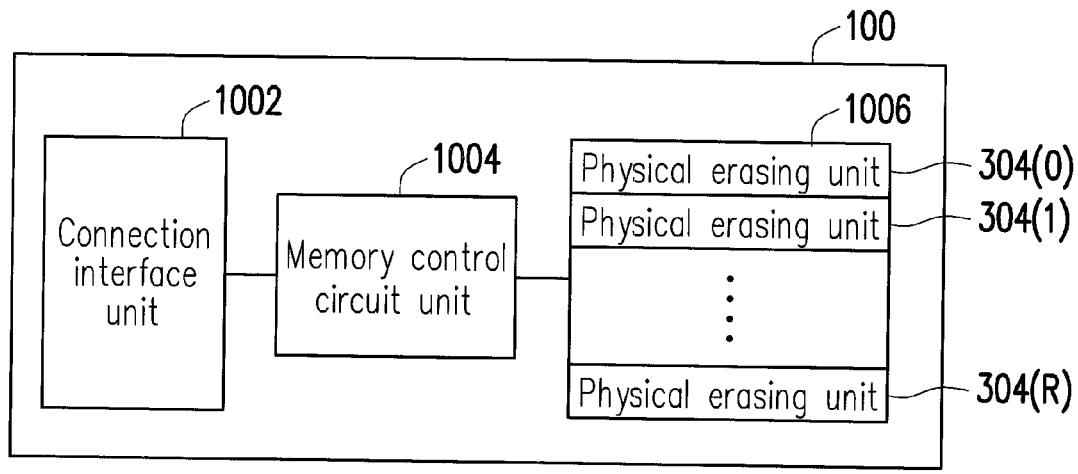
FIG. 11 is a schematic block diagram illustrating the memory storage device shown in FIG. 8.

FIG. 11 is a schematic block diagram illustrating the memory storage device shown in FIG. 8.

With reference to FIG. 11, the memory storage device 100 includes a connection interface unit 1002, a memory control circuit unit 1004, and a rewritable non-volatile memory module 1006.

In the present embodiment, the connection interface unit 1002 complies with a serial advanced technology attachment (SATA) standard. However, it should be understood that the present invention is not limited thereto, and the connection interface unit 1002 may also comply with a parallel advanced technology attachment (PATA) standard, an institute of electrical and electronic Engineers (IEEE) 1394 standard, a peripheral component interconnect express (PCI Express) standard, a universal serial bus (USB) standard, an ultra high speed-I (UHS-I) interface standard, an ultra high speed-II (UHS-II) interface standard, a secure digital (SD) interface standard, a memory stick (MS) interface standard, a multi media card (MMC) interface standard, a compact flash (CF) interface standard, an integrated device electronics (IDE) standard, or other suitable standards. In the present exemplary embodiment, the connection interface unit 1002 may be packaged with the memory control circuit unit 1004 in one chip or laid outside a chip having the memory control circuit unit 1004.

The memory control circuit unit 1004 is configured to execute a plurality of logic gates or control commands which are implemented in a hardware form or in a firmware form and perform operations such as data writing, reading or erasing in the rewritable non-volatile memory module 1006 according to the command of the host system 1000.

The rewritable non-volatile memory module 1006 is coupled to the memory control circuit unit 1004 and configured to store data written by the host system 1000. The rewritable non-volatile memory module 1006 has a plurality of physical erasing units 304(0) to 304(R). The physical erasing units 304(0) to 304(R) may belong to the same memory die or different memory dies. Each of the physical erasing units includes a plurality of physical programming units, and the physical programming units belonging to the same physical erasing unit may be written separately but erased at the same time. In the present exemplary embodiment, each of the physical erasing units is composed of 64 physical programming units. However, in other exemplary embodiment of the invention, each of the physical erasing units may be composed of 128 or 256 programming units or any other number of physical programming units.

In detail, each physical erasing unit is the smallest unit for erasing. That is to say, each physical erasing unit has the least number of memory cells to be erased altogether. Each physical programming unit is the smallest unit for programming. Namely, each physical programming unit is the smallest unit for writing data. Each of the physical programming units generally includes a data bit area and a redundant bit area. The data bit area includes a plurality of physical access addresses for storing user data, and the redundant bit area is configured for storing system data (e.g., control information and error correcting codes). In the present exemplary embodiment, the data bit area of each physical programming unit contains 16 physical access addresses, and the size of each physical access address is 512 bytes (512 B). However, in other exemplary embodiments, the data bit area may contain a greater or a smaller number of physical access addresses, and the number and the size of the physical access addresses are not limited in the present invention. For instance, in an exemplary embodiment, the physical erasing units are physical blocks, and the physical programming units are physical pages or physical sectors, which are not limited in the present invention.

In the present exemplary embodiment, the rewritable non-volatile memory module 1006 may be a multi level cell (MLC) NAND flash memory module (i.e., a flash memory module capable of storing data of 2 bits in one memory cell). However, the invention is not limited thereto, and the rewritable non-volatile memory module 1006 may also be a single-level cell (SLC) NAND flash memory module (i.e., a flash memory module capable of storing data of one bit in one memory cell), a trinary-level cell (TLC) NAND flash memory module (i.e., a flash memory module capable of storing data of 3 bits in one memory cell), any other flash memory module, or any other memory module with the same characteristics.

Figure 12:
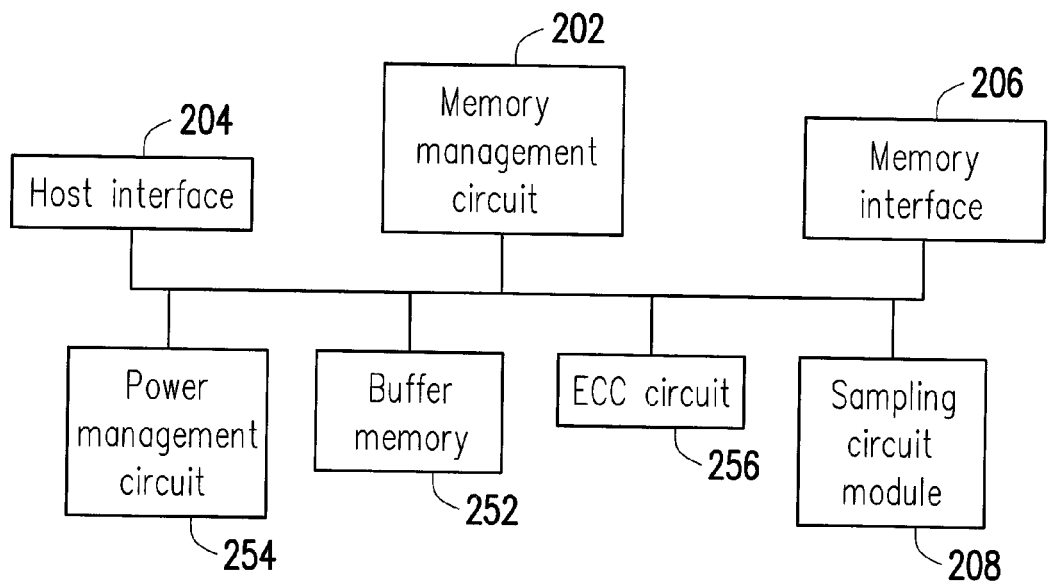
FIG. 12 is a schematic block diagram illustrating a memory control circuit unit according to an exemplary embodiment of the present invention.

FIG. 12 is a schematic block diagram illustrating a memory control circuit unit according to an exemplary embodiment of the present invention.

With reference to FIG. 12, the memory control circuit unit 1004 includes a memory management circuit 202, a host interface 204, a memory interface 206 and a sampling circuit module 208.

The memory management circuit 202 is configured to control the overall operation of the memory control circuit unit 1004. In particular, the memory management circuit 202 has a plurality of control commands, and when the memory storage device 100 is operated, the control commands are executed to perform operations, such as data writing, data reading and data erasing.

In the present exemplary embodiment, the control commands of the memory management circuit 202 are implemented in a firmware form. For instance, the memory management circuit 202 has a microprocessor (not shown) and a read-only memory (not shown), and the control commands are burnt into the read-only memory. When the memory storage device 100 is operated, the control commands are executed by the microprocessor to perform data operations, such as data writing, data reading or data erasing.

In another exemplary embodiment of the present invention, the control commands of the memory management circuit 202 may also be stored in a specific area (e.g., a system area in the memory module exclusively used for storing system data) of the rewritable non-volatile memory module 1006 as program codes. Moreover, the memory management circuit 202 has a microprocessor unit (not shown), a read-only memory (not shown), and a random access memory (not shown). Specifically, the read-only memory has a boot code. When the memory circuit unit 1004 is enabled, the microprocessor unit first executes the boot code for loading the control commands stored in the rewritable non-volatile memory module 1006 into the random access memory of the memory management circuit 202. Afterwards, the microprocessor unit executes the control commands for data operations such as data writing, data reading and data erasing.

Additionally, in another exemplary embodiment of the present invention, the control commands of the memory management circuit 202 may also be implemented in a hardware form. For example, the memory management circuit 202 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory management unit is configured for managing the physical erasing units of the rewritable non-volatile memory module 1006, the memory writing unit is configured for issuing a writing command to the rewritable non-volatile memory module 1006 in order to write data into the rewritable non-volatile memory module, the memory reading unit is configured for issuing a reading command to the rewritable non-volatile memory module 1006 in order to read data from the rewritable non-volatile memory module 1006, the memory erasing unit is configured for issuing an erasing command to the rewritable non-volatile memory module 1006 in order to erase data from the rewritable non-volatile memory module 1006, the data processing unit is configured for processing both the data to be written into and the data to be read from the rewritable non-volatile memory module 1006. The memory writing circuit is configured to issue a writing command to the rewritable non-volatile memory module 1006 to write data to the rewritable non-volatile memory module 1006, the memory reading circuit is configured to issue a reading command to the rewritable non-volatile memory module 1006 in order to read data from the rewritable non-volatile memory module 1006, the memory erasing circuit is configured to issue an erasing command to the rewritable non-volatile memory module 1006 to erase data from the rewritable non-volatile memory module 1006, and the data processing circuit is configured to process data to be written to the rewritable non-volatile memory module 1006 or data read from the rewritable non-volatile memory module 1006.

The host interface 204 is coupled to the memory management circuit 202 and configured to receive and identify commands and data transmitted from the host system 1000. Namely, the commands and data sent by the host system 1000 are transmitted to the memory management circuit 202 through the host interface 204. In the present exemplary embodiment, the host interface 204 complies with the SATA standard. However, it should be understood that the present invention is not limited thereto, and the host interface 204 may also comply with the PATA standard, the IEEE 1394 standard, the PCI Express standard, the USB standard, the UHS-I standard, the UHS-II standard, the SD standard, the MS standard, the MMC standard, the CF standard, the IDE standard, or other suitable standards for data transmission.

The memory interface 206 is coupled to the memory management circuit 202 for accessing the rewritable non-volatile memory module 1006. In other words, the data to be written into the rewritable non-volatile memory module 1006 is converted to a format acceptable for the rewritable non-volatile memory module 1006 by the memory interface 206.

The sampling circuit module 208 is coupled to the memory management circuit 202 and configured to sample a data signal to obtain sampled data. The data signal may be related to the data to be written into or read from the rewritable non-volatile memory module 1006.

Figure 13:
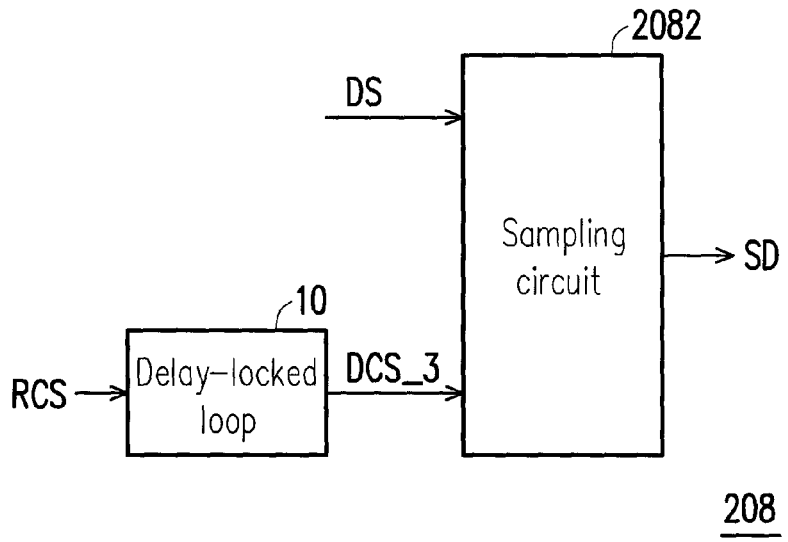
FIG. 13 is a schematic diagram illustrating a sampling circuit module according to an exemplary embodiment of the present invention.

FIG. 13 is a schematic diagram illustrating a sampling circuit module according to an exemplary embodiment of the present invention.

With reference to FIG. 13, the sampling circuit module 208 includes a delay-locked loop 10 and a sampling circuit 2082.

The delay-locked loop 10 is configured to receive a reference clock signal RCS and delay the reference clock signal RCS so as to provide a delay clock signal (e.g., the third delay clock signal DCS_3) to the sampling circuit 2082. The delay-locked loop 10 of the present exemplary embodiment is same as or similar to the delay-locked loop 10 of the exemplary embodiment illustrated in FIG. 1 and thus, will not be repeatedly described. The delay-locked loop 10 may include one or more delay circuits 12 and/or one more delay circuits 52. Additionally, in another exemplary embodiment, the delay-locked loop 10 may also be disposed outside the memory control circuit unit 1004 and provide the delay clock signal (e.g., the third delay clock signal DCS_3) to the memory control circuit unit 1004. In an exemplary embodiment, the delay-locked loop 10 may also provide the delay clock signal (e.g., the third delay clock signal DCS_3) to any other chip (or circuit element) in the memory storage device 100, which is not limited in the present invention.

The sampling circuit 2082 is coupled to the delay-locked loop 10 and configured to receive a data signal DS and the delay clock signal (e.g., the third delay clock signal DCS_3) from the delay-locked loop 10. The data signal DS may be related to the data to be written into or read from the rewritable non-volatile memory module 1006. The sampling circuit 2082 samples the data signal DS according to the delay clock signal (e.g., the third delay clock signal DCS_3) from the delay-locked loop 10 to obtain sampled data SD and outputs the sampled data SD. Then, the memory management circuit 202 transmits data corresponding to the sampled data SD to the rewritable non-volatile memory module 1006 or to the host system 1000. In an exemplary embodiment, the data corresponding to the sampled data SD may be bit data contained in the sampled data SD. After the sampled data SD is obtained, the memory management circuit 202 transmits the sampled data SD to the rewritable non-volatile memory module 1006 or to the host system 1000. However, in another exemplary embodiment, the data corresponding to the sampled data SD may be bit data obtained by means of operations, such as verification and/or conversion, on the sampled data SD, but the present invention is not limited thereto.

To be specific, if the data signal is related to the data to be written into the rewritable non-volatile memory module 1006 by the host system 1000, the memory management circuit 202 obtains one or more bits (which are also referred to as first bits) according to the sampled data SD and transmits a writing command sequence to the rewritable non-volatile memory module 1006, where the writing command sequence is configured to instruct to write the first bits into the rewritable non-volatile memory module 1006. The writing command sequence may include one or more command codes or program codes. If the sampled data SD is related to the data read from the rewritable non-volatile memory module 1006, the memory management circuit 202 obtains one or more bits (which are also referred to as second bits) according to the sampled data SD and transmits the second bits to the host system 1000. Specially, during the process of sampling the data signal DS, if the delay stage of the delay line circuit has to be changed due to the change of a temperature or a voltage (e.g., a writing voltage or reading voltage of the rewritable non-volatile memory module 1006), the delay stage of at least one of the first delay line circuit 124 and the second delay line circuit 126 may be immediately changed so as to ensure the accuracy of the sampled data SD.

In an exemplary embodiment, the memory control circuit unit 1004 further includes a buffer memory 252, a power management circuit 254, and an error checking and correcting (ECC) circuit 256.

The buffer memory 252 is coupled to the memory management circuit 202 and configured to temporarily store data and commands from the host system 1000 or data from the rewritable non-volatile memory module 1006.

The power management circuit 254 is coupled to the memory management circuit 202 and configured to control the power of the memory storage device 100.

The ECC circuit 256 is coupled to the memory management circuit 202 and configured to execute an error checking and correcting (ECC) procedure to ensure the accuracy of data. In particular, when the memory management circuit 202 receives a writing command from the host system 1000, The ECC circuit 256 generates an error checking and correcting (ECC) code for the data corresponding to writing command, and the memory management circuit 202 writes the data and the ECC code corresponding to the writing command into the rewritable non-volatile memory module 1006. Subsequently, when reading the data from the rewritable non-volatile memory module 1006, the memory management circuit 202 also reads the ECC code corresponding to the data simultaneously, and the ECC circuit 256 performs the ECC procedure on the read data according to the ECC code.

The present invention proposes a method for generating delay clock signals and a method for sampling data.

Figure 14:
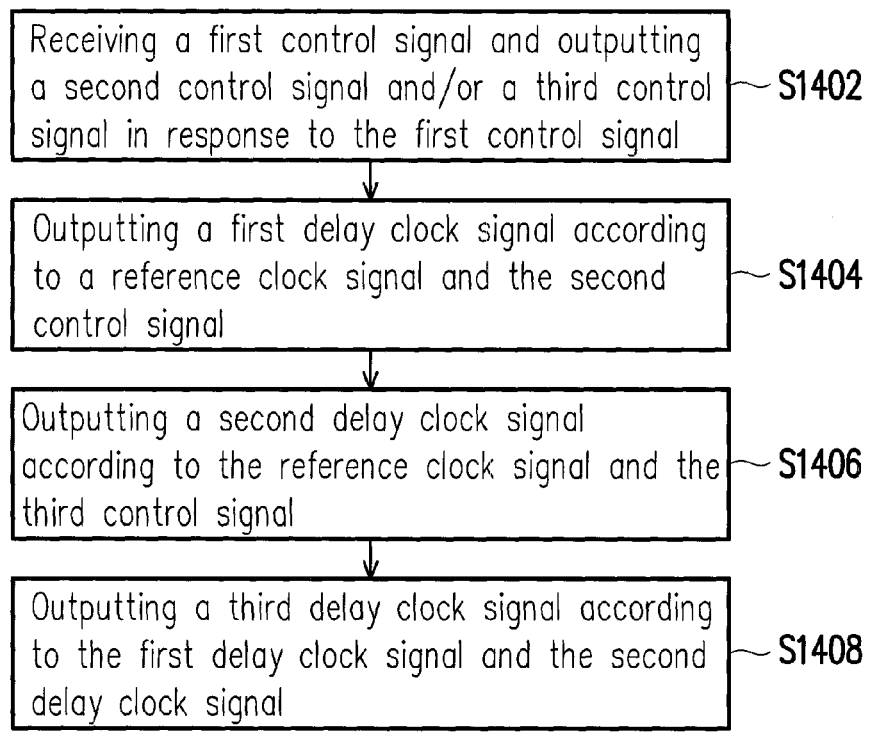
FIG. 14 is a flowchart of a method for generating delay clock signals according to an exemplary embodiment of the present invention.

FIG. 14 is a flowchart of a method for generating delay clock signals according to an exemplary embodiment of the present invention.

With reference to FIG. 14, in step S1402, a first control signal is received, and a second control signal and/or a third control signal is output in response to the first control signal. In step S1404, a first delay clock signal is output according to a reference clock signal and the second control signal. In step S1406, a second delay clock signal is output according to the reference clock signal and the third control signal. In step S1408, a third delay clock signal is output according to the first delay clock signal and the second delay clock signal. Moreover, each step illustrated in FIG. 14 has been described as above and will not repeated hereinafter.

Figure 15:
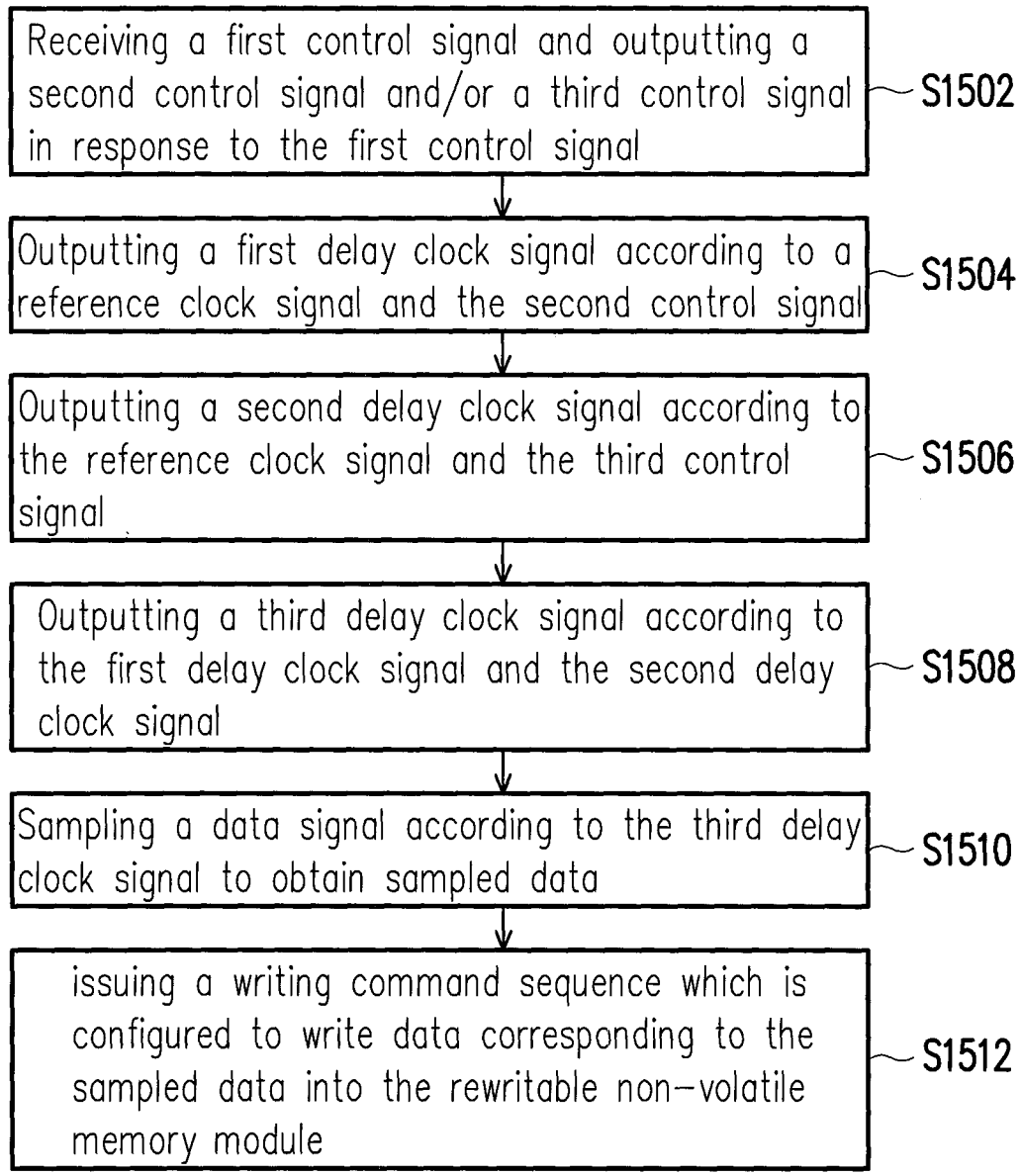
FIG. 15 is a flowchart of a method for sampling data according to an exemplary embodiment of the present invention.

FIG. 15 is a flowchart of a method for sampling data according to an exemplary embodiment of the present invention.

With reference to FIG. 15, Steps S1502 through S1508 are respectively same as or similar to steps S1402 through S1408 of the exemplary embodiment illustrated in FIG. 4 and thus, will not be repeatedly described. In step S1510, a data signal is sampled according to the third delay clock signal to obtain sampled data. In step S1512, a writing command sequence is issued, where the writing command sequence is configured to write data corresponding to the sampled data into the rewritable non-volatile memory module. However, in another exemplary embodiment, in step S1512, it may also be a scenario where data corresponding to the sampled data is transmitted to the host system 1000. Moreover, each step illustrated in FIG. 15 has been described as above and will not repeated hereinafter.

It is to be mentioned that the present invention is neither intended to limit the performing sequence of steps S1404 and S1406 of the exemplary embodiment illustrated in FIG. 14 nor intended to limit the performing sequence of steps S1504 and S1506 of the exemplary embodiment illustrated in FIG. 15, and each step illustrated in FIG. 14 and FIG. 15 may be implemented as a plurality of program codes or circuits, but construes no limitations to the present invention. Moreover, the methods illustrated in FIG. 14 and FIG. 15 may be implemented together with the exemplary embodiments above or may be performed solely, and the present invention is not limited thereto.

In light of the foregoing, in an exemplary embodiment of the invention, the delay clock signals can be continuously output, and phases of the output delay clock signals can be continuously locked by means of maintaining the normal output from at least one of the delay line circuits and updating the delay stage of an idling delay circuit in background. Additionally, the probability of the clock jitter occurring to the output delay clock signal may also be reduced. In one of the exemplary embodiments of the present invention, before one time of the data writing operation or the data reading operation is completely, if the delay stage of the slave delay circuit has to be updated due to the change of the temperature or the voltage, the delay stage of the slave delaying circuit can also be immediately updated, without waiting until the data writing operation or the data reading operation is completely performed. Thereby, the accuracy of the data writing operation or the data reading operation performed on the data can be enhanced.

The previously described exemplary embodiments of the present invention have the advantages aforementioned, wherein the advantages aforementioned not required in all versions of the invention. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sampling circuit module, comprising:
   a delay-locked loop, comprising:
   a control circuit, configured to receive a reference clock signal to output a first control signal; and
   a delay circuit, coupled to the control circuit and comprising:
      a state machine circuit, configured to receive the first control signal and output a second control signal and/or a third control signal in response to the first control signal;
      a first delay line circuit, coupled to the state machine circuit and configured to receive the reference clock signal and the second control signal to output a first delay clock signal;
      a second delay line circuit, coupled to the state machine circuit and configured to receive the reference clock signal and the third control signal to output a second delay clock signal; and
      a delay signal output circuit, coupled to the first delay line circuit, the second delay line circuit and the state machine circuit and configured to receive the first delay clock signal and the second delay clock signal to output a third delay clock signal; and
   a sampling circuit, coupled to the delay-locked loop and configured to receive the third delay clock signal and sample a data signal according to the third delay clock signal to obtain sampled data,
   wherein a first delay stage of the first delay line circuit is changed from a first stage to a second stage when the first delay line circuit is in an idle state and the third delay clock signal is outputted,
   wherein a second delay stage of the second delay line circuit is changed from a third stage to a fourth stage when the second delay line circuit is in the idle state and the third delay clock signal is outputted.

2. The sampling circuit module according to claim 1, wherein the second control signal is configured to control the first delay stage of the first delay line circuit, and the third control signal is configured to control the second delay stage of the second delay line circuit.

3. The sampling circuit module according to claim 2, wherein the state machine circuit is further configured to output a fourth control signal, and the operation of the delay signal output circuit receiving the first delay clock signal and the second delay clock signal to output the third delay clock signal comprises:
   receiving the first delay clock signal, the second delay clock signal and the fourth control signal to output the third delay clock signal.

4. The sampling circuit module according to claim 3, wherein the delay signal output circuit comprises a first switch circuit and a second switch circuit, the fourth control signal comprises a first enable signal and a second enable signal, the first enable signal is configured to control a first switching state of the first switch circuit, and the second enable signal is configured to control a second switching state of the second switch circuit.

5. The sampling circuit module according to claim 4, wherein the delay signal output circuit further comprises a phase interpolation circuit configured to receive a first output signal of the first switch circuit and/or a second output signal of the second switch circuit to form the third delay clock signal.

6. The sampling circuit module according to claim 5, wherein the first delay line circuit comprises a plurality of first delay units, the second delay line circuit comprises a plurality of second delay units, the phase interpolation circuit comprises at least one third delay unit and at least one fourth delay unit, an input terminal of the at least one third delay unit is coupled to an output terminal of the first switch circuit, an input terminal of the at least one fourth delay unit is coupled to an output terminal of the second switch circuit, and an output terminal of the at least one third delay unit and an output terminal of the at least one fourth delay unit are coupled to an output terminal of the phase interpolation circuit.

7. The sampling circuit module according to claim 4, wherein the first delay stage of the first delay line circuit is changed from the first stage to the second stage only when the first switch circuit is in a turn-off state, and the second delay stage of the second delay line circuit is changed from the third stage to the fourth stage only when the second switch circuit is in the turn-off state.

8. The sampling circuit module according to claim 1, wherein the delay signal output circuit maintains the first delay line circuit and the second delay line circuit both not in the idle state at a specific time point during the third delay clock signal is outputted.

9. The sampling circuit module according to claim 1, wherein the delay signal output circuit comprises a first switch circuit, a second switch circuit and a phase interpolation circuit,
   wherein the first switch circuit is configured between the first delay line circuit and the phase interpolation circuit,
   wherein the second switch circuit is configured between the second delay line circuit and the phase interpolation circuit,
   wherein the phase interpolation circuit receives the first delay clock signal through the first switch circuit, receives the second delay clock signal through the second switch circuit and performs a phase interpolation operation on the first delay clock signal and the second delay clock signal when the first switch circuit and the second switch circuit are both in a turn-on state, such that a phase of the third delay clock signal is between a phase of the first delay clock signal and a phase of the second delay clock signal.

10. A memory control circuit unit for controlling a rewritable non-volatile memory module, wherein the rewritable non-volatile memory module comprises a plurality of physical erasing units, the memory control circuit unit comprising:
    a host interface, configured to be coupled to a host system;
    a memory interface, configured to be coupled to the rewritable non-volatile memory module;
    a sampling circuit module, comprising:
       a delay-locked loop, comprising:
       a control circuit, configured to receive a reference clock signal to output a first control signal; and
       a delay circuit, coupled to the control circuit and comprising:

a state machine circuit, configured to receive the first control signal and output a second control signal and/or a third control signal in response to the first control signal;

a first delay line circuit, coupled to the state machine circuit and configured to receive the reference clock signal and the second control signal to output a first delay clock signal;

a second delay line circuit, coupled to the state machine circuit and configured to receive the reference clock signal and the third control signal to output a second delay clock signal; and a delay signal output circuit, coupled to the first delay line circuit, the second delay line circuit and the state machine circuit and configured to receive the first delay clock signal and the second delay clock signal to output a third delay clock signal; and a sampling circuit, coupled to the delay-locked loop and configured to receive the third delay clock signal and sample a data signal according to the third delay clock signal to obtain sampled data; and a memory management circuit, coupled with the host interface, the memory interface and the sampling circuit module and configured to issue a writing command sequence, wherein the writing command sequence is configured to write data corresponding to the sampled data into the rewritable non-volatile memory module, wherein a first delay stage of the first delay line circuit is changed from a first stage to a second stage when the first delay line circuit is in an idle state and the third delay clock signal is outputted, wherein a second delay stage of the second delay line circuit is changed from a third stage to a fourth stage when the second delay line circuit is in the idle state and the third delay clock signal is outputted.

11. The memory control circuit unit according to claim 10, wherein the second control signal is configured to control the first delay stage of the first delay line circuit, and the third control signal is configured to control the second delay stage of the second delay line circuit.

12. The memory control circuit unit according to claim 11, wherein the state machine circuit is further configured to output a fourth control signal, and the operation of the delay signal output circuit receiving the first delay clock signal and the second delay clock signal to output the third delay clock signal comprises:

receiving the first delay clock signal, the second delay clock signal and the fourth control signal to output the third delay clock signal.

13. The memory control circuit unit according to claim 12, wherein the delay signal output circuit comprises a first switch circuit and a second switch circuit, the fourth control signal comprises a first enable signal and a second enable signal, the first enable signal is configured to control a first switching state of the first switch circuit, and the second enable signal is configured to control a second switching state of the second switch circuit.

14. The memory control circuit unit according to claim 13, wherein the delay signal output circuit further comprises a phase interpolation circuit configured to receive a first output signal of the first switch circuit and/or a second output signal of the second switch circuit to form the third delay clock signal.

15. The memory control circuit unit according to claim 14, wherein the first delay line circuit comprises a plurality of first delay units, the second delay line circuit comprises a plurality of second delay units, the phase interpolation circuit comprises at least one third delay unit and at least one fourth delay unit, an input terminal of the at least one third delay unit is coupled to an output terminal of the first switch circuit, an input terminal of the at least one fourth delay unit is coupled to an output terminal of the second switch circuit, and an output terminal of the at least one third delay unit and an output terminal of the at least one fourth delay unit are coupled to an output terminal of the phase interpolation circuit.

16. The memory control circuit unit according to claim 13, wherein the first delay stage of the first delay line circuit is changed from the first stage to the second stage only when the first switch circuit is in a turn-off state, and the second delay stage of the second delay line circuit is changed from the third stage to the fourth stage only when the second switch circuit is in the turn-off state.

17. A method for sampling data, comprising:

receiving a first control signal and outputting a second control signal and/or a third control signal in response to the first control signal;

outputting a first delay clock signal according to a reference clock signal and the second control signal;

outputting a second delay clock signal according to the reference clock signal and the third control signal;

outputting a third delay clock signal according to the first delay clock signal and the second delay clock signal;

sampling a data signal according to the third delay clock signal to obtain sampled data;

issuing a writing command sequence, wherein the writing command sequence is configured to write data corresponding to the sampled data into a rewritable non-volatile memory module;

changing a first delay stage of a first delay line circuit from a first stage to a second stage when the first delay line circuit is in an idle state and the third delay clock signal is outputted; and changing a second delay stage of a second delay line circuit from a third stage to a fourth stage when the second delay line circuit is in the idle state and the third delay clock signal is outputted.

18. The method according to claim 17, wherein the second control signal is configured to control the first delay stage of the first delay line circuit, and the third control signal is configured to control the second delay stage of the second delay line circuit.

19. The method according to claim 18, further comprising:

outputting a fourth control signal, wherein the step of outputting the third delay clock signal according to the first delay clock signal and the second delay clock signal comprises:

output the third delay clock signal according to the first delay clock signal, the second delay clock signal and the fourth control signal.

20. The method according to claim 19, wherein the fourth control signal comprises a first enable signal and a second enable signal, the first enable signal is configured to control a first switching state of the first switch circuit, and the second enable signal is configured to control a second switching state of the second switch circuit.

21. The method according to claim 20, wherein the step of outputting the third delay clock signal according to the first delay clock signal, the second delay clock signal and the fourth control signal comprises:

forming the third delay clock signal according to a first output signal of the first switch circuit and/or a second output signal of the second switch circuit.

22. The method according to claim 20, wherein the first delay stage of the first delay line circuit is changed from the first stage to the second stage only when the first switch circuit is in a turn-off state, and the second delay stage of the second delay line circuit is changed from the third stage to the fourth stage only when the second switch circuit is in the turn-off state.

* * * * *